US012588472B2

(12) United States Patent
Lee et al.

(10) Patent No.: US 12,588,472 B2
(45) Date of Patent: Mar. 24, 2026

(54) VIA ACCURACY MEASUREMENT

(71) Applicant: Taiwan Semiconductor Manufacturing Company, Ltd., Hsinchu (TW)

(72) Inventors: Wei-Hsuen Lee, Hsinchu City (TW); Hung En Hsu, Taipei City (TW); Kuo-Ching Hsu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 331 days.

(21) Appl. No.: 18/459,870

(22) Filed: Sep. 1, 2023

(65) Prior Publication Data

US 2025/0079242 A1 Mar. 6, 2025

(51) Int. Cl.
H01L 21/66 (2006.01)
G01R 31/28 (2006.01)

(52) U.S. Cl.
CPC .......... H01L 22/14 (2013.01); G01R 31/2853 (2013.01); G01R 31/2884 (2013.01); H01L 22/32 (2013.01)

(58) Field of Classification Search
CPC . H01L 22/14; H01L 22/32; H01L 2224/8112; G01R 31/2851; G01R 31/2853; G01R 31/2884; G01R 31/2896
See application file for complete search history.

(56) References Cited

U.S. PATENT DOCUMENTS

| | | | |
|---|---|---|---|
| 10,923,421 B2 | 2/2021 | Chen | |
| 11,282,761 B2 | 3/2022 | Wu | |
| 2017/0005054 A1* | 1/2017 | Chiu | H01L 24/20 |
| 2023/0260888 A1* | 8/2023 | Kim | H01L 23/49838 |
| | | | 257/678 |
| 2024/0014081 A1* | 1/2024 | Takao | H01L 22/34 |

FOREIGN PATENT DOCUMENTS

CN 107644863 A * 1/2018 ......... H01L 23/3185

* cited by examiner

*Primary Examiner* — Lauren R Bell
(74) *Attorney, Agent, or Firm* — HAYNES AND BOONE, LLP

(57) ABSTRACT

Methods and pad structures to test via accuracy are provided. A method according to the present disclosure includes forming a first pad and a second pad on a device component, wherein the second pad includes a via landing area and a clearance opening, providing a core substrate that includes a cavity, placing the device component in the cavity, forming a build-up film over the device component and the core substrate, forming a first contact via extending through the build-up film to contact the landing area and a second contact via extending through build-up film and the clearance opening, and performing a continuity test to determine whether the second contact via is in contact with the second pad.

20 Claims, 20 Drawing Sheets

VIA ACCURACY MEASUREMENT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Besides fabricating more devices on a semiconductor wafer, the IC industry also has its sight on more compact packaging that has smaller form factor and less routing. Fabrication of some device packages involves laser drilling to form via openings to expose contact pads or connections. As devices get smaller and smaller, the accuracy for forming contact vias is in the spotlight. When the via openings miss the contact pads, the subsequent metal fill may be deposited over interfaces of contact pads and surrounding insulation materials. Dendrites of the metal fill may form at such interfaces, causing electrical shorts. Various imaging techniques are being used to ensure via accuracy or to detect defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
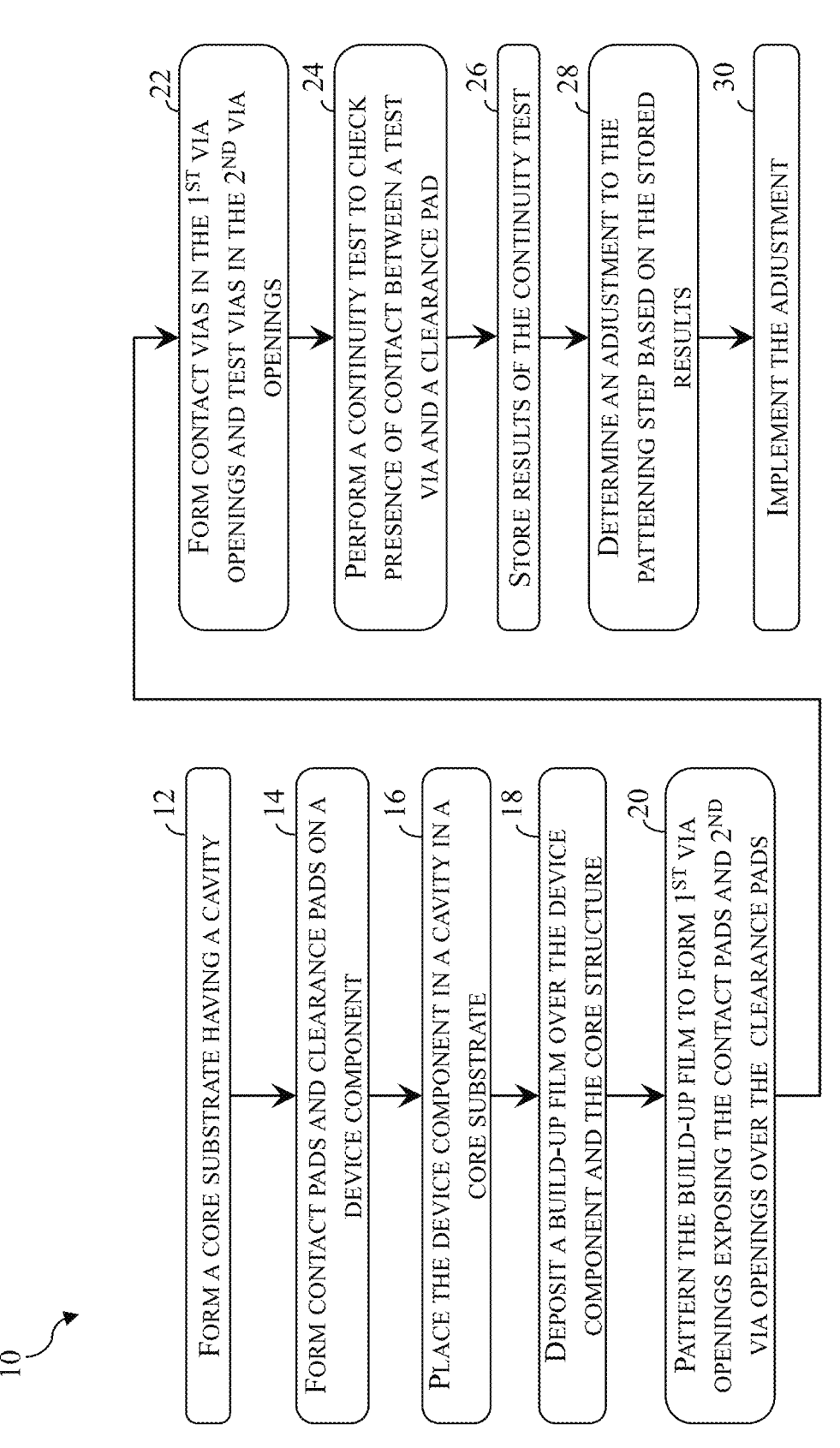
FIG. 1 illustrates a flowchart of a method 10 for detecting via misalignment and improving via accuracy, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Modern device packaging has involved more and more vertical integration of active or passive devices. Such vertical integration usually relies on various vias formed through one or more dielectric layers or semiconductor substrates. In some examples where contact pads are covered by a build-up film, laser drilling may be used to form via openings in the build-up film to expose portions of the contact pads. Shifts in laser vias may inadvertently expose interfaces between a contact pad and a surrounding dielectric material. It may cause delamination of the dielectric material from the contact pad. When a metal fill is deposited over the via opening, dendrites of the metal fill may form at the interfaces. The dendrites may cause device failure or electrical shorts over time. When the resulting device package is subject to a stress electrical test, such as a biased highly accelerated stress test (b-HAST) or a high-voltage temperature humidity bias test (HV-THB), such dendrites may cause immediate device failure. Various imaging techniques, such as optical microscopy, parallel lapping, or three-dimensional X-ray (3D X-ray), have been used to measure via accuracy. In some instances, a few contact vias may be sampled and measured using the aforementioned imaging techniques. While these imaging techniques generally work well, they have their limits in terms of metrology accuracy and resolution. Additionally, because only a few contact vias are sampled, some contact vias with via shift may go undetected.

The present disclosure provides a method to measure via accuracy for a larger population of contact vias by an electrical continuity test. In additional to contact pads that make functional connections to an underlying device component, the present disclosure implements clearance pads that include a clearance opening that is configured to receive a test via. When the vias are perfectly aligned, the test via passes through the clearance opening without touching the clearance pad. When via shift is present, the test via may contact an edge of the clearance opening. Such contact may be detected in a continuity test while a perfectly aligned test via will form an open circuit with the clearance pad. The clearance opening may come in different shapes to implement different testing standards or provide via shift information. The measurement data may be stored as quality check results or used to adjust the via alignment.

The various aspects of the present disclosure will now be described in more detail with reference to the figures. In that regard, FIG. 1 is a flowchart illustrating a method 10 for detecting via misalignment and improving via accuracy according to various aspects of the present disclosure. Method 10 is merely an example and is not intended to limit the present disclosure to what is explicitly illustrated in method 10. Additional steps may be provided before, during and after method 10, and some steps described can be replaced, eliminated, or moved around for additional embodiments of the method. Not all steps are described herein in detail for reasons of simplicity. Method 10 is described below in conjunction with FIGS. 2-20, which are fragmentary cross-sectional views or top views of a workpiece or an embedded device component thereof at different stages of fabrication according to embodiments of method 10. Additionally, throughout the present application and across different embodiments, like reference numerals denote like features with similar structures and compositions, unless otherwise excepted. Source/drain region(s) may refer to a source or a drain, individually or collectively, dependent upon the context.

Figure 2:
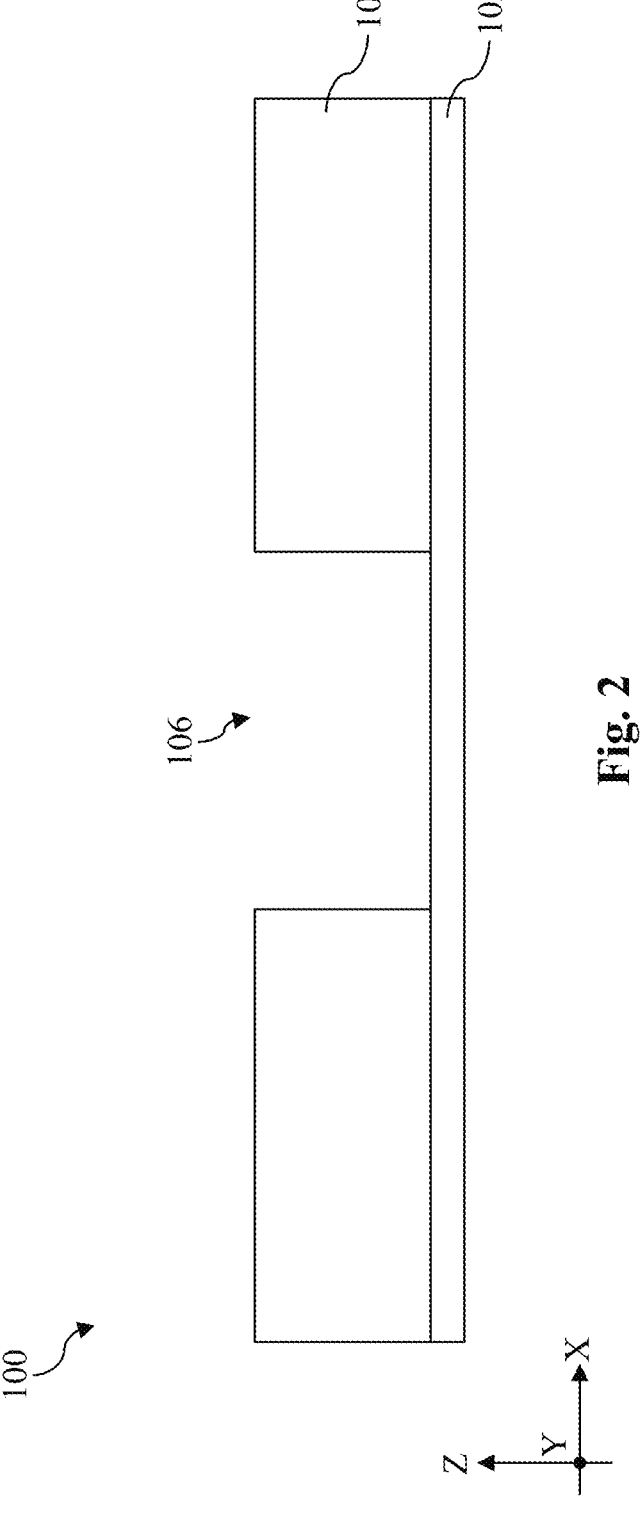
FIGS. 2-20 include fragmentary cross-sectional views or top views of a device package workpiece or a device component embedded therein at various stages of operations during the performance of the method 10 in FIG. 1, according to various aspects of the present disclosure.
Figure 3:
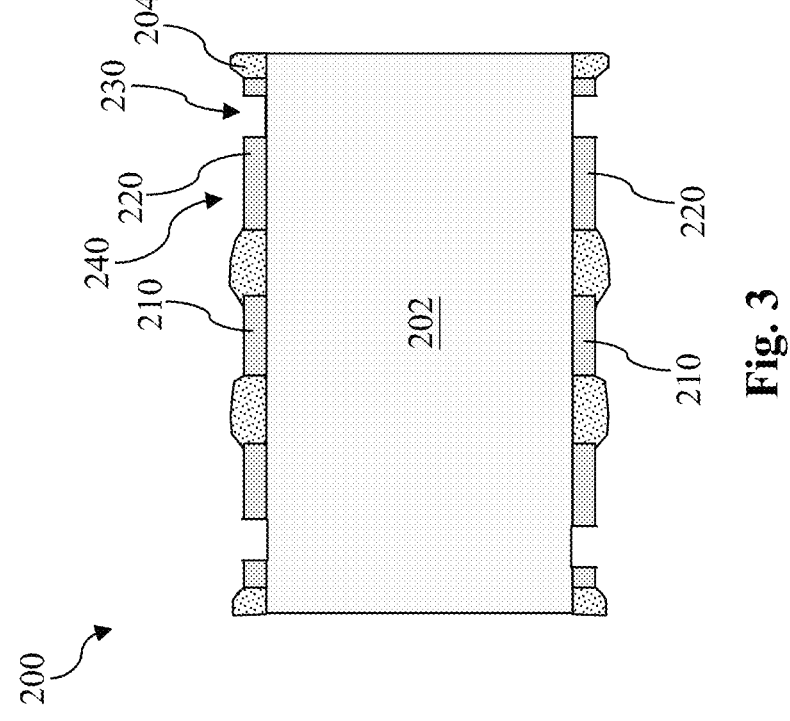
Figure 3:
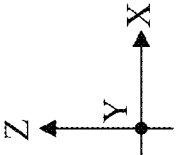

Referring to FIGS. 1 and 2, method 10 includes a block 12 where a core substrate 100 is formed. In some embodiments, the core substrate 100 includes a core dielectric layer 104 deposited on a carrier substrate 102. The carrier substrate 102 may include quartz or glass and functions to provide mechanical strength. The core dielectric layer 104 may include a pre-impregnated composite fiber (prepreg), Ajinomoto build-up film (ABF), paper, fiberglass, epoxy resin, non-woven glass fabric, other insulating materials or combinations thereof. In some implementation, the core dielectric layer 104 may include a laminate of more than one dielectric layers for reinforcement. In the depicted embodiments, the core substrate 100 includes a cavity 106 defined in the core dielectric layer 104 to receive an embedded device, such as a passive device.

Referring to FIGS. 1 and 3-7, method 10 includes a block 14 where contact pads 210 and clearance pads 220 are formed on a device component 200. The device component 200 includes a passive device 202, which may be a multilayer ceramic capacitor (MLCC), a metal-insulator-metal (MIM) capacitor, a deep trench capacitor (DTC), or a different type of capacitor. In some instances, because the passive device 202 includes silicon, it may also be referred to as a silicon cap. The device component 200 also includes contact pads 210 and clearance pads 220 that are laterally insulated from one another by an insulation layer 204. In some implementations, the insulation layer 204 includes polyimide (PI). Referring to FIGS. 3-7, each of the contact pads 210 is solid and does not include any through holes or openings. While not explicitly illustrated in the figures, each of the contact pads 210 is electrically coupled to the passive device 202. Each of the clearance pads 220 includes a clearance opening, which may be a round clearance opening 230 shown in FIG. 4, a rectangular clearance opening 232 or 2320 shown in FIG. 5, a cross-shape clearance opening 234 shown in FIG. 6, or a square clearance opening 236 shown in FIG. 7. In these embodiments, each of the clearance opening is large enough to receive a contact via with an appropriate clearance between an edge of the clearance opening and a sidewall of the contact via. Each of the clearance pads 220 also includes a via landing area 240. The via landing area 240 is configured for a contact via to land thereon to form electrical connection. Like the contact pads 210, each of the clearance pads 220 is electrically coupled to the passive device 202.

While each of the clearance pads 220 is electrically coupled to the passive device 202, the clearance openings (such as the round clearance openings 230 in FIG. 4, the rectangular clearance opening 232 in FIG. 5, the cross-shape clearance openings 234 shown in FIG. 6, or the square clearance openings 236 shown in FIG. 7) are disposed over and expose a contact-free area of the passive device 202. The contact-free area refers to an area that is free of any exposed contacts, contact vias, or contact pads. In other words, each of the clearance openings may expose a surface of a dielectric layer or a surface of a semiconductor feature. As will be described in further detail below, when a test via is received in a clearance opening, the test via would not be electrically coupled to the clearance pad unless the test via comes in contact with an edge of the clearance opening due to via shift.

Figure 4:
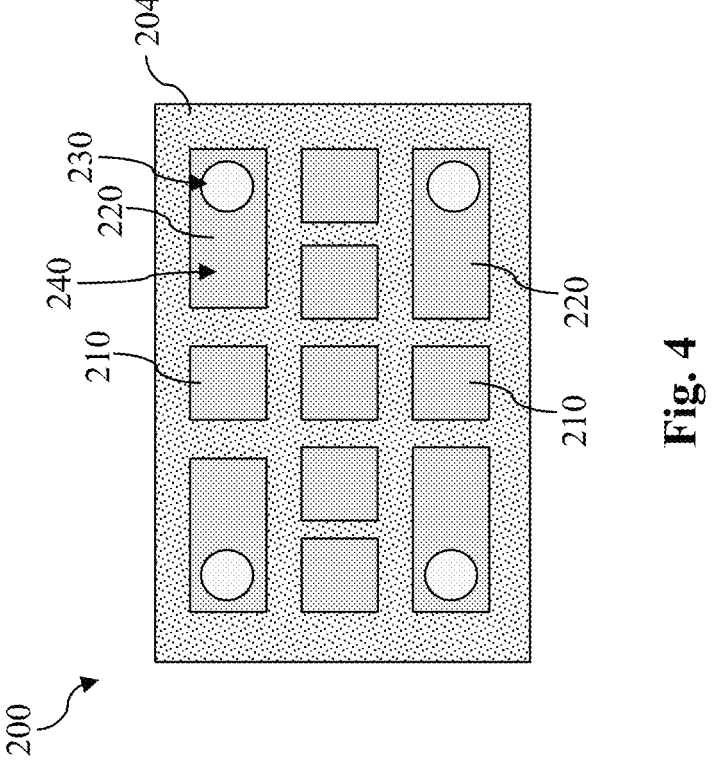
Figure 4:
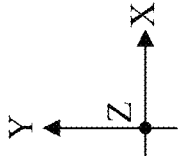
Figure 5:
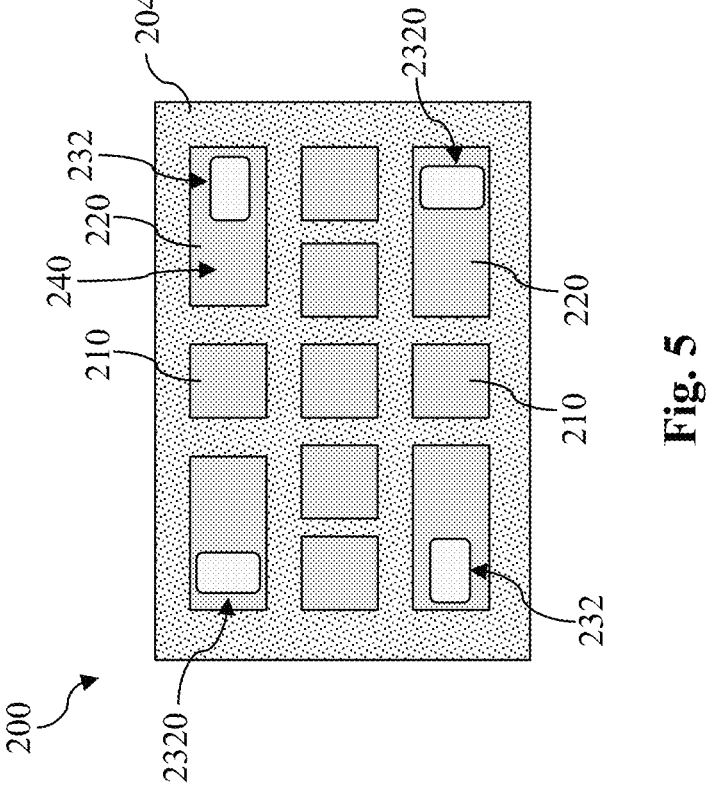
Figure 6:
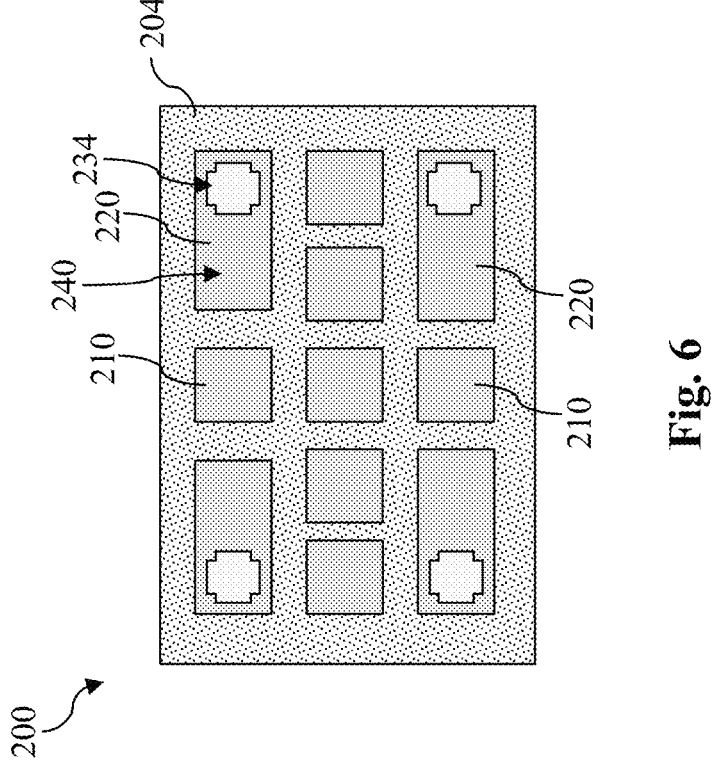
Figure 7:
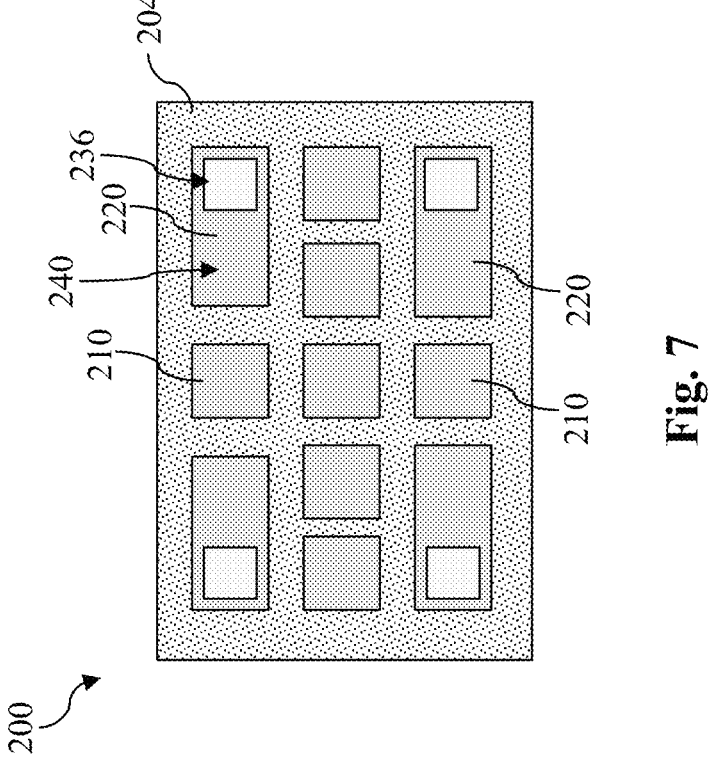

The different shapes of the clearance openings may provide different functionalities. For example, the round clearance opening 230 in FIG. 4 provides uniform detection of via shift along all direction. Rectangular clearance openings 232 and rectangular clearance openings 2320 in FIG. 5 are elongated along two perpendicular directions. In the depicted embodiments, rectangular clearance openings 232 are elongated along the X direction and rectangular clearance openings 2320 are elongated along the Y direction. The smaller Y-direction width of the rectangular clearance openings 232 provide more sensitive via shift detection along the Y direction than along the X direction. The smaller X-direction width of the rectangular clearance opening 2320 provide more sensitive via shift detection along the X direction. When the rectangular clearance openings 232 and the rectangular clearance opening 2320 are coupled to two different test circuits, they may provide information on comparison of via shift along the X direction (X shift) and via shift along the Y direction (Y shift). The cross-shape clearance openings 234 in FIG. 6 provide more sensitive via shift detection along the 45° angle (i.e., a diagonal direction with respect to the X direction and the Y direction). The square clearance openings 236 in FIG. 7 provide uniform via shift detection along the X direction or the Y direction. Compared to the cross-shape clearance opening 234, the square clearance openings 236 provide more lenient via shift detection along the 45° angle (i.e., a diagonal direction with respect to the X direction and the Y direction).

Figure 8:
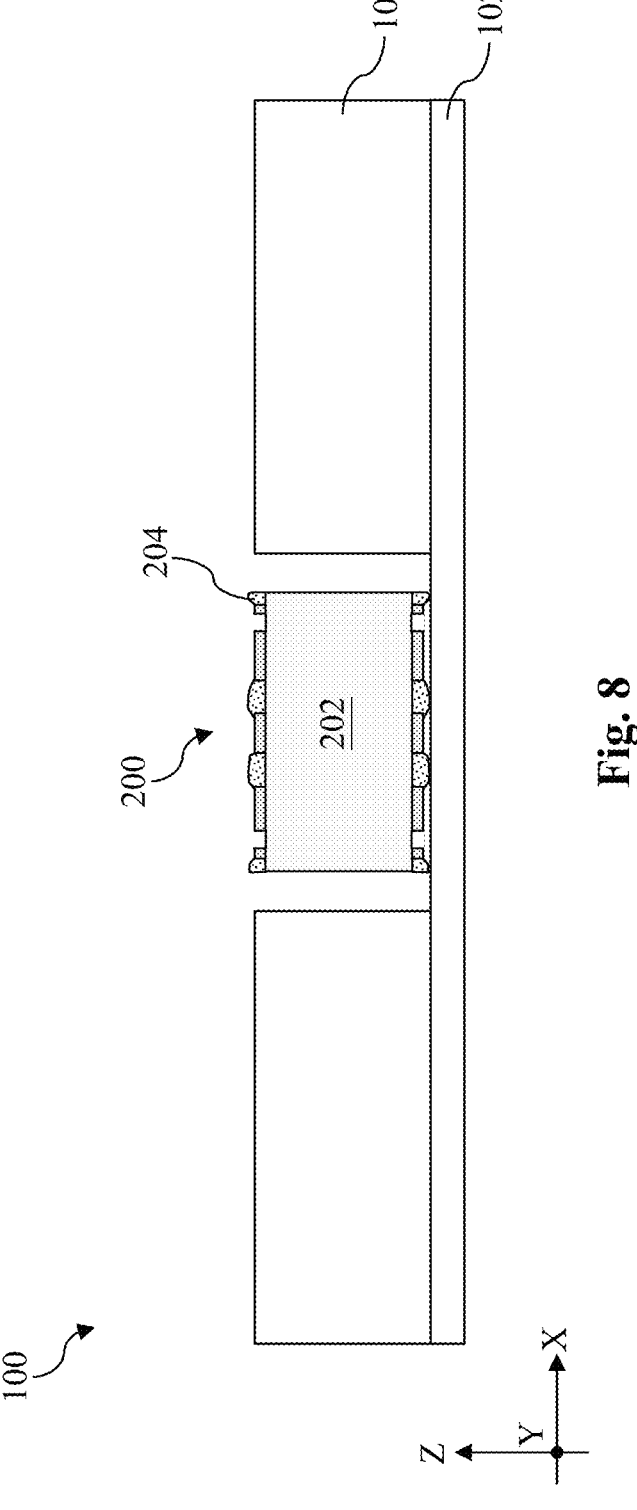
Figure 9:
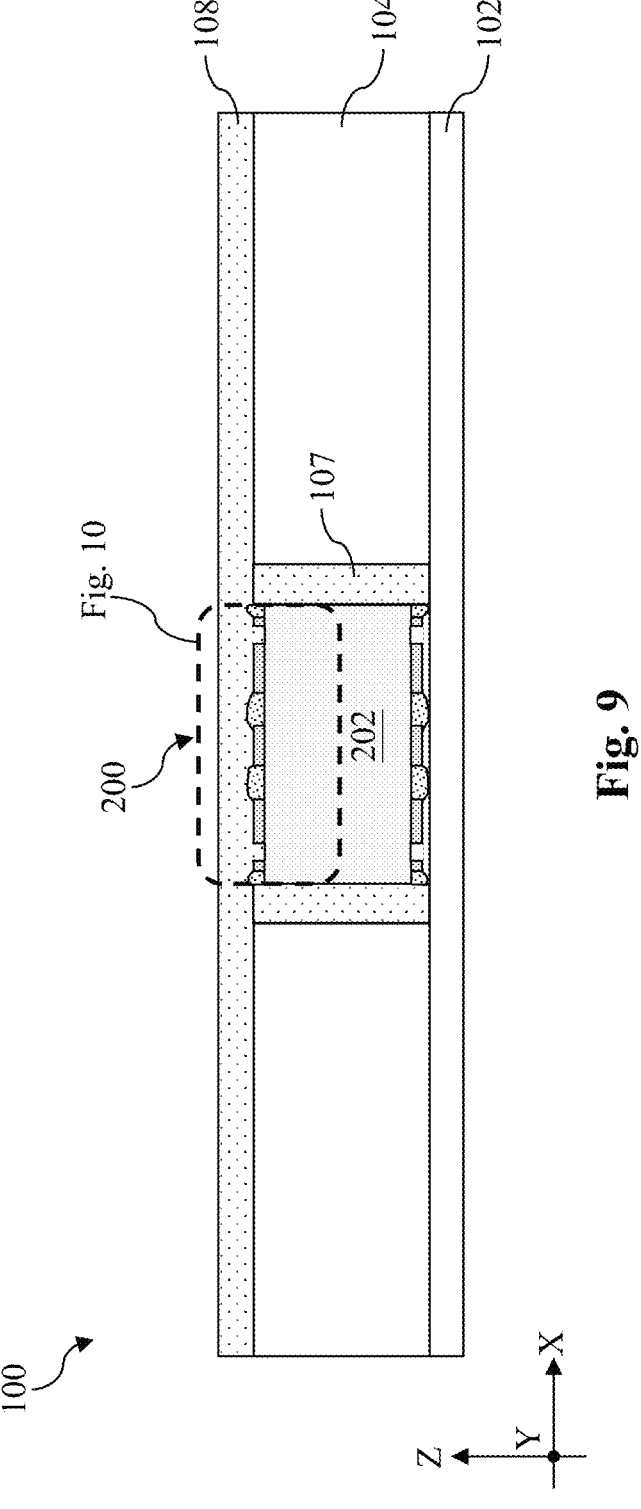

Referring to FIGS. 1, 8 and 9, method 10 includes a block 16 where the device component 200 is placed in the cavity 106 defined in the core dielectric layer 104. As shown in FIG. 8, the device component 200 that includes contact pads 210 and clearance pads 220, is placed in the cavity 106. In some embodiments, the device component 200 may be attached to the carrier substrate 102 by an adhesive layer. After the device component 200 is place in the cavity 106, an encapsulant 107 may be deposited to fill the gaps between the device component and the core dielectric layer 104. In some implementations, the encapsulant 107 may include silicon oxide, phosphosilicate glass (PSG), borophosphosilicate glass (BPSG), polybenzoxazoles (PBO), polyimide (PI), benzocyclobutene (BCB), or the like. The encapsulant 107 may be deposited by spin coating, lamination, chemical vapor deposition (CVD), the like, or a combination thereof.

Referring to FIGS. 1 and 9, method 10 includes a block 18 where a first build-up film 108 is deposited over the device component 200 and the core substrate 100. At block 18, the first build-up film 108 is laminated on the top surface of the core substrate 100, including the core dielectric layer 104, the encapsulant 107 and the device component 200. In some embodiments, the first build-up film 108 may be an Ajinomoto Build-up Film (ABF). After the lamination of the first build-up film 108, the first build-up film 108 is cured by annealing at a temperature between about 150° C. and about 200° C. The dotted line area in FIG. 9 is enlarged and shown in FIG. 10.

Figure 10:
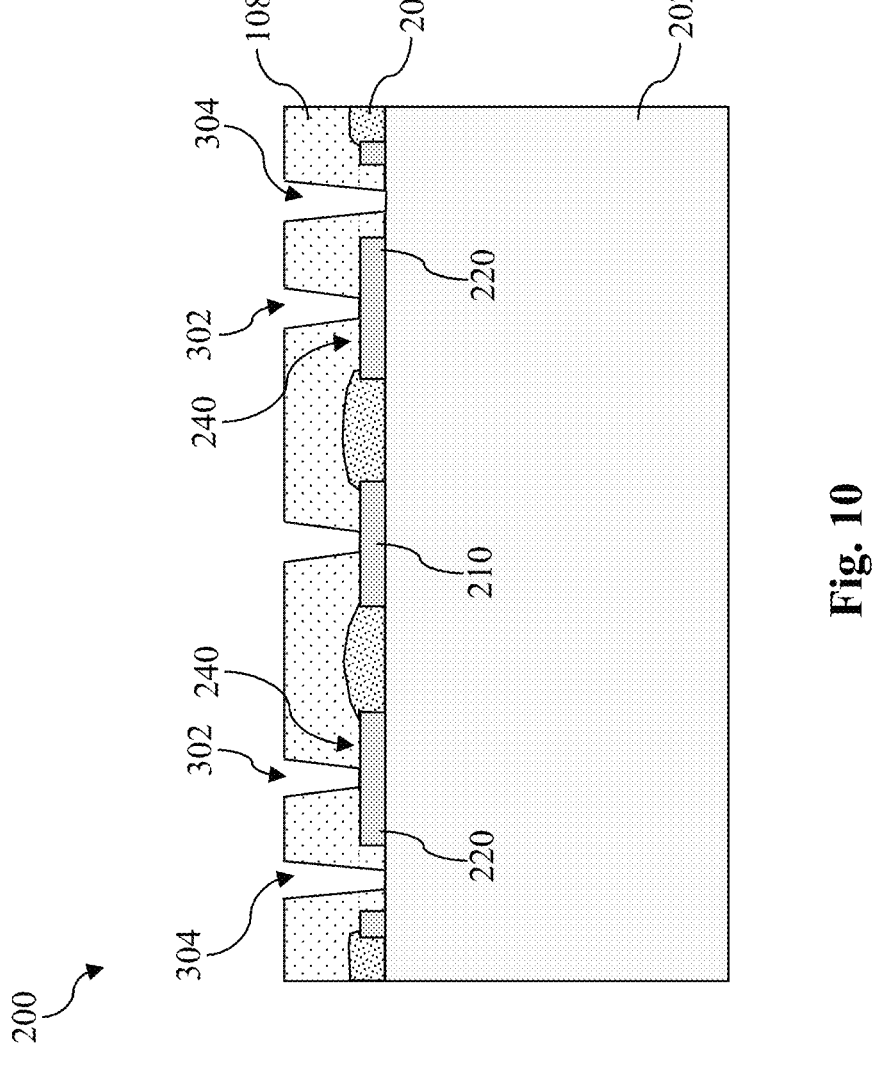

Referring to FIGS. 1 and 10, method 10 includes a block 20 where the first build-up film 108 is patterned to form first via openings 302 exposing the contact pads 210 and second via openings 304 exposing the clearance pad 220. In some embodiments, the first build-up film 108 is patterned using laser drilling to form the first via openings 302 and the second via openings 304. As shown in FIG. 10, the first build-up film 108 may partially or completely fill the clearance openings (such as the round clearance openings 230, the rectangular clearance opening 232, the cross-shape clearance openings 234, or the square clearance openings 236). The second via openings 304 extends completely through the first build-up film 108, including the portion of the first build-up film 108 that fills up the clearance openings. The first via openings 302 extend through the first build-up film 108 above the contact pads 210 and the via landing area 240 of the clearance pads 220. As shown in FIG. 10, compared to the first via openings 302, the second via openings 304 extend further towards to the passive device 202 by the thickness of the contact pads 210 or the clearance pads 220, which may be between about 5 μm and about 20 μm. According to the present disclosure, when there is no via shift, the second via openings 304 do not expose an edge of the clearance opening. When via shift is present, the second via openings 304 may expose a portion of the edge of the clearance opening.

Figure 11:
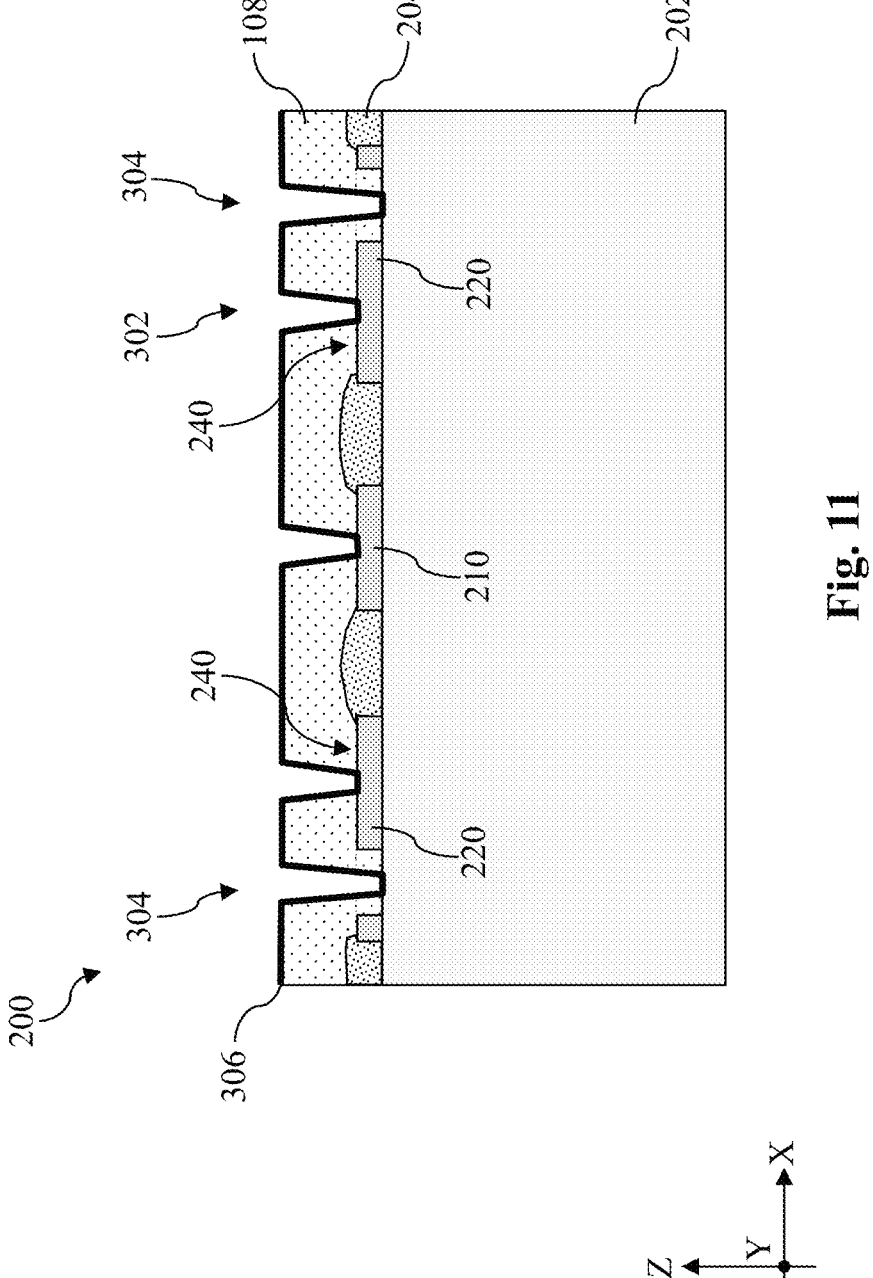
Figure 12:
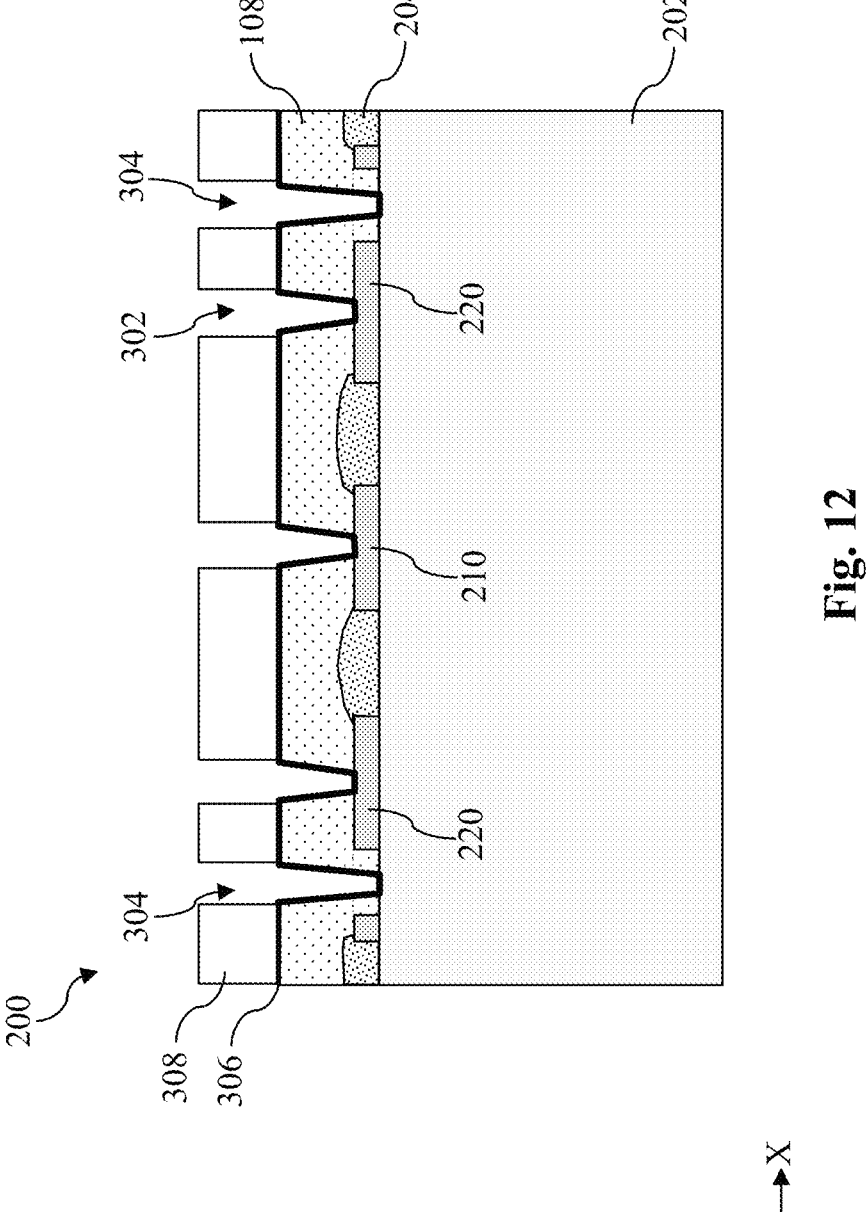
Figure 13:
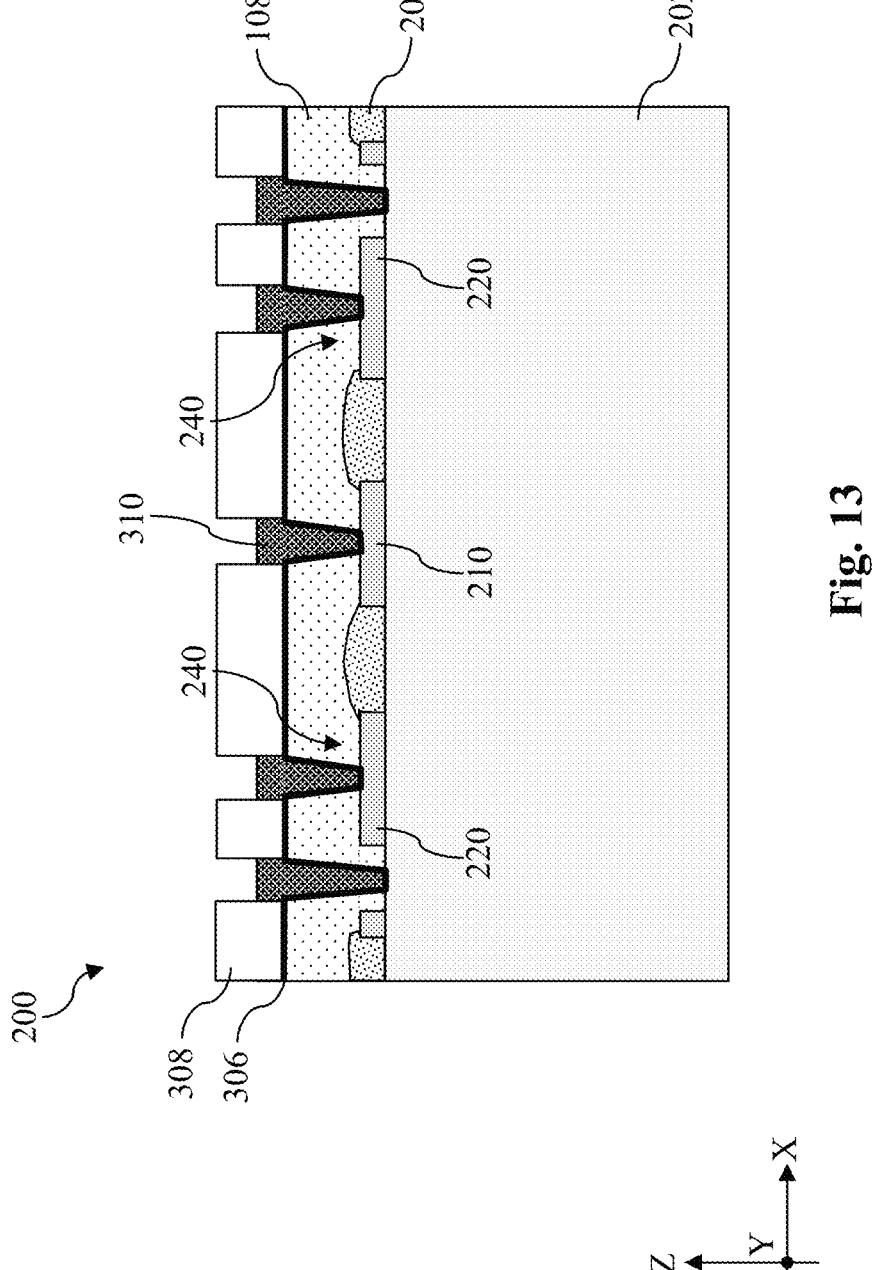

Referring to FIGS. 1 and 11-20, method 10 includes a block 22 where contact vias 312 are formed in the first via openings 302 and test vias 314 are formed in the second via openings 304. In an example process, a seed layer 306 is deposited over the first build-up film 108, the first via openings 302 and the second via openings 304 by physical vapor deposition (PVD), as shown in FIG. 11. The seed layer 306 may include titanium (Ti), copper (Cu), or alloy thereof. A photoresist layer 308 is deposited over the seed layer 306 and is patterned using photolithography process to form openings to expose the first via openings 302 and the second via openings 304, as shown in FIG. 12. As a result, the seed layer 306 in the first via openings 302 and the second via openings 304 is exposed. Referring to FIG. 13, a metal fill material 310 is then selectively deposited on the exposed portions of the seed layer 306 by electroplating or electroless plating. In some embodiments, the metal fill material 310 includes copper (Cu). After the photoresist layer 308 is removed by ashing, contact vias 312 are formed in the first via openings 302 and test vias 314 are formed in the second via openings 304. Each of the contact vias 312 either lands on a contact pad 210 or a via landing area 240 of a clearance pad 220. By design, when no via shift is present, each of the test vias 314 should extend through the clearance opening (such as the round clearance openings 230, the rectangular clearance opening 232, the cross-shape clearance openings 234, or the square clearance openings 236) of a clearance pad without physically touching any part thereof. However, when via shift is present, one or more test vias 314 may come in physical contact with the clearance pad, forming electrically connection.

Figure 14:
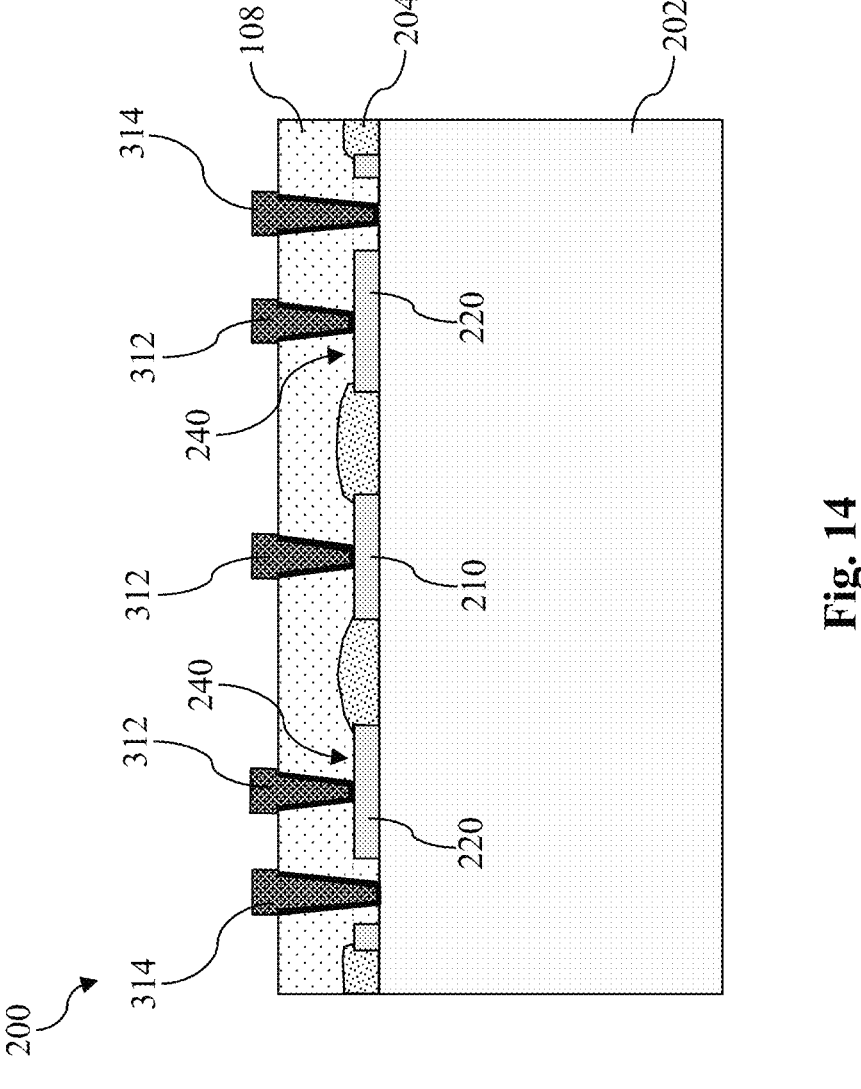

Referring still to FIG. 14, each of the contact vias 312 includes the seed layer 306 to interface the first build-up film 108 and a contact pad 210 (or a via landing area 240 of a clearance pad 220) and the metal fill material 310 that is spaced apart from the first build-up film 108 and the contact pad 210 (or a via landing area 240 of a clearance pad 220) by the seed layer 306. Each of the test vias 314 includes the seed layer 306 to interface the first build-up film 108 and the passive device 202 and the metal fill material 310 that is spaced apart from the first build-up film 108 and the passive device 202 by the seed layer 306. In some embodiments represented in FIG. 14, a height of the test vias 314 along the Z direction is greater than a height of the contact via 312 along the Z direction.

Figure 15:
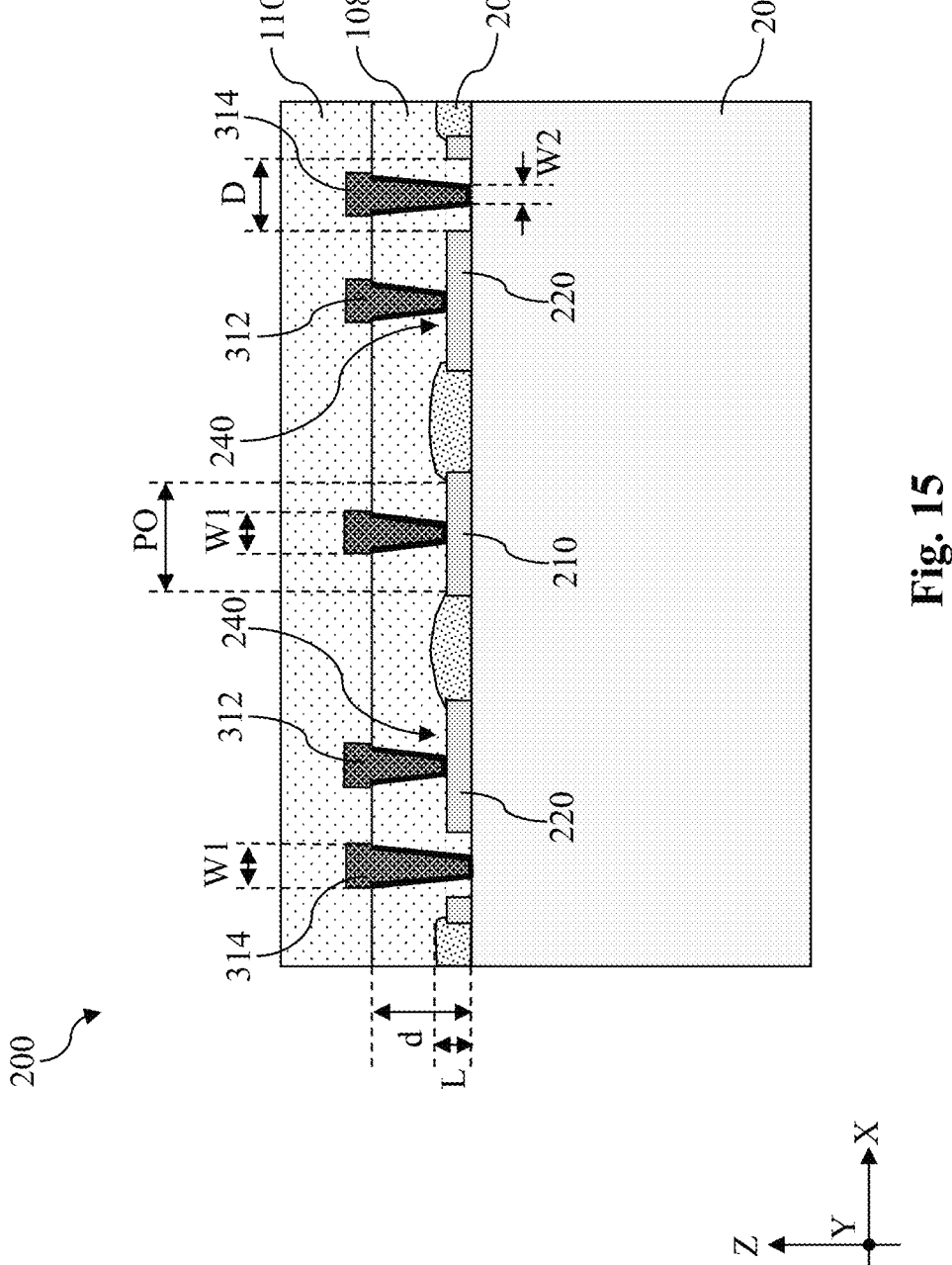
Figure 16:
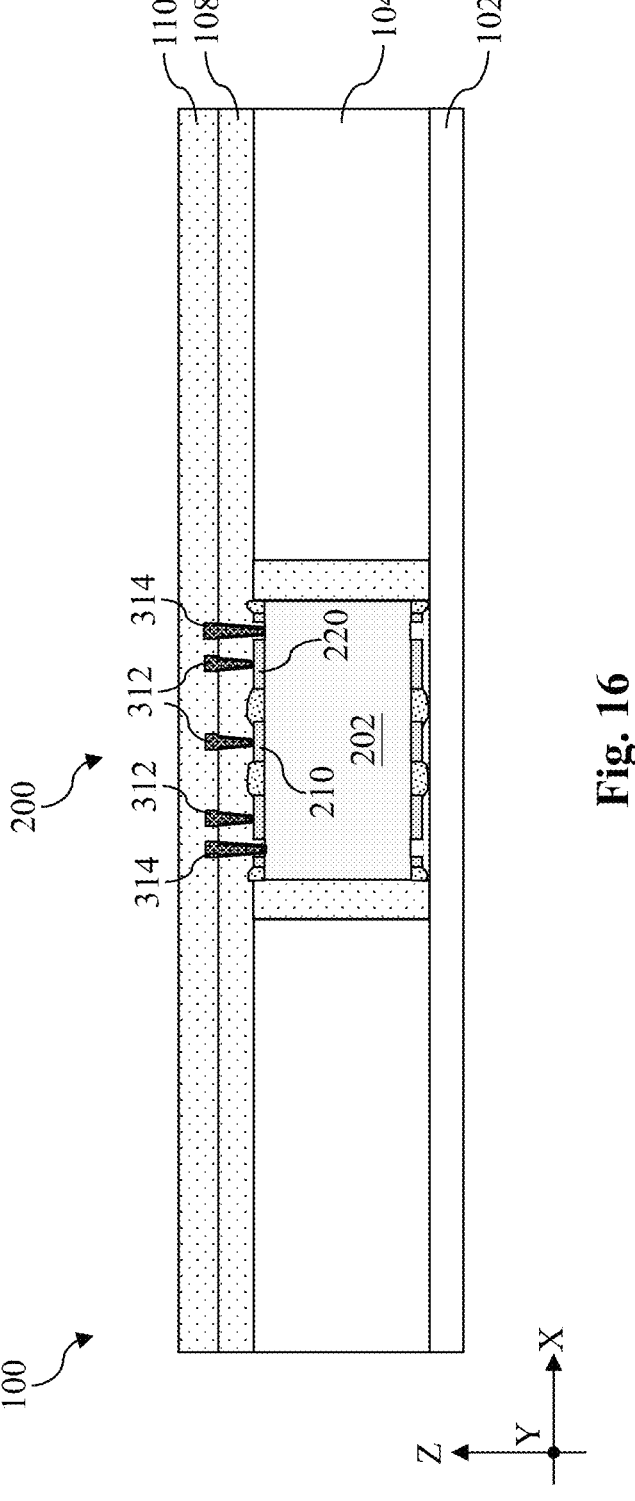

Reference is now made to FIGS. 15 and 16. A second build-up film 110 is laminated on the top surface of the first build-up film 108, the contact vias 312 and the test vias 314. In some embodiments, the second build-up film 110 may be an Ajinomoto Build-up Film (ABF). After the lamination of the second build-up film 110, the second build-up film 110 is cured by annealing at a temperature between about 150° C. and about 200° C. While not explicitly shown in the figures, the second build-up film 110 is patterned using laser drilling to expose the contact vias 312 and the test vias 314. Another seed layer is deposited over the patterned second build-up film 110, the exposed contact vias 312 and the exposed test vias 314. Another patterned photoresist layer is formed over this seed layer and then another metal fill material is deposited over the exposed portions of this seed layer by electroplating or electroless plating. A process cycle including the deposition of a build-up film, laser patterning of the build-up film, deposition of a seed layer, deposition of a photoresist, patterning of the photoresist, and deposition of a metal fill material may be repeated a number of times as required by design. The present disclosure and accompanying figures describe and illustrate deposition of the first build-up film 108, formation of the contact vias 312, formation of test vias 314, and deposition of the second build-up film 110. Additionally, the carrier substrate 102 may be removed from a back surface of the core substrate 100 and further build-up films and metal layers may be formed using similar process cycles. Formation of further metal layers, contact vias, and build-up films is fully envisioned but is omitted for brevity.

Reference is still made to FIG. 15. Each of the contact vias 312 and the test vias 314 may have a tapered profile that tapers downward. In some embodiments, each of the contact vias 312 and the test vias 314 has a first width W1 at its top surface. The first width W1 may be between about 20 μm and about 60 μm. At its bottom surface, each of the contact vias 312 and the test vias 314 has a second width W2. In some instances, the second width W2 may be between 80% and about 85% of the first width W1. In some implementations, the second width W2 may be between about 16 μm and about 51 μm. The clearance opening may have a dimension D, which may be diameter of the round clearance opening 230 shown in FIG. 17, a width or a length of the rectangular clearance opening 232 shown in FIG. 18, a length of one of the arms of the cross-shape clearance opening 234 shown in FIG. 19, or a width of the square clearance opening shown in FIG. 20. In some embodiments, the dimension D may be between about 100 μm and about 200 μm. To allow for a reasonable process tolerance, a ratio of the first width W1 to the dimension D may be between about 20% and 50%. Because an interface between the insulation layer 204 and a contact pad 210 (or a clearance pad 220) tends to promote metal dendrite formation (e.g., copper dendrite formation) when a contact via is disposed over the interface and a portion of the insulation layer 204 may be disposed over a portion of the top surface of the contact pad 210 (or the clearance pad 220), an opening in the insulation layer 204 is also relevant. In some instances, the openings in the insulation layer 204 may have an opening dimension PO between about 115 µm and about 215 µm. It can be seen that the dimension D of the clearance opening is slightly smaller than the opening dimension PO to ensure that the via shift is never large enough for the contact via 312 to land on an interface between the insulation layer 204 and a contact pad 210. The insulation layer 204 may have a thickness L between about 10 µm and about 25 µm. The first build-up film 108 or the second build-up film 110 may have thickness d between about 25 µm and about 35 µm.

Figure 17:
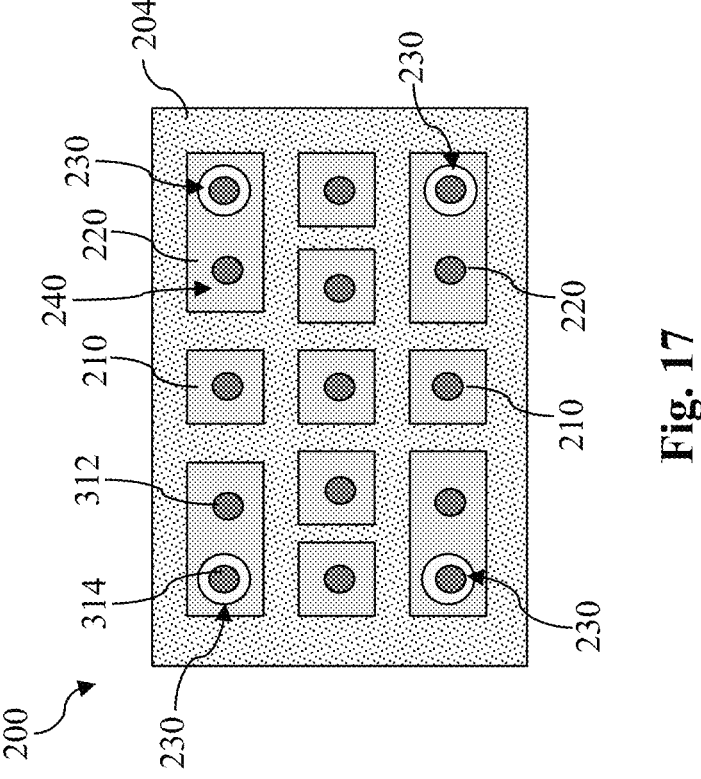
Figure 18:
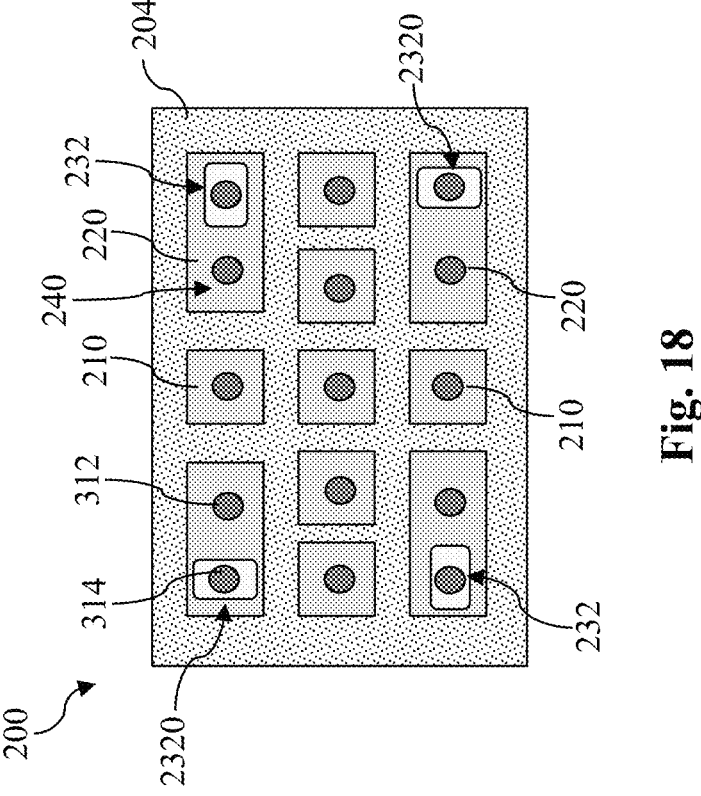
Figure 19:
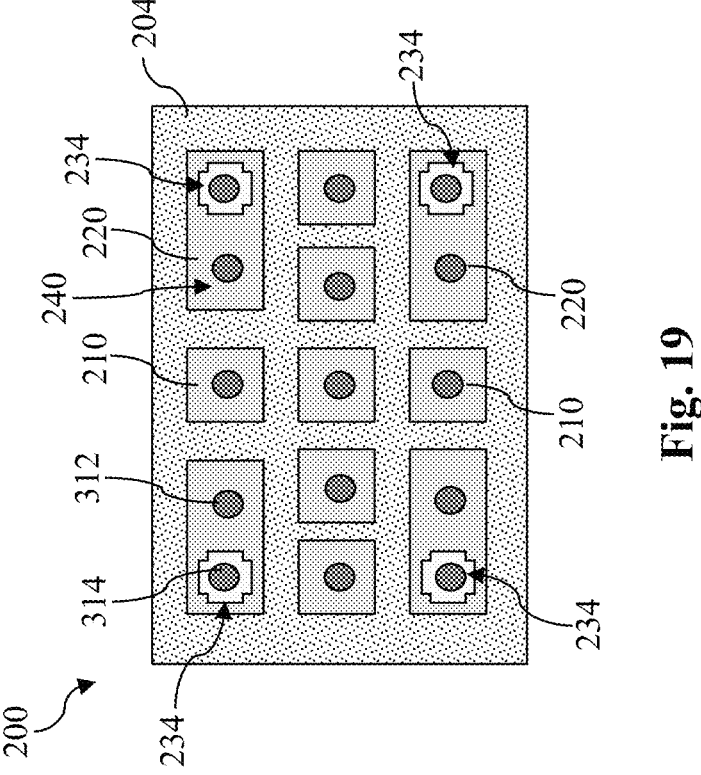
Figure 20:
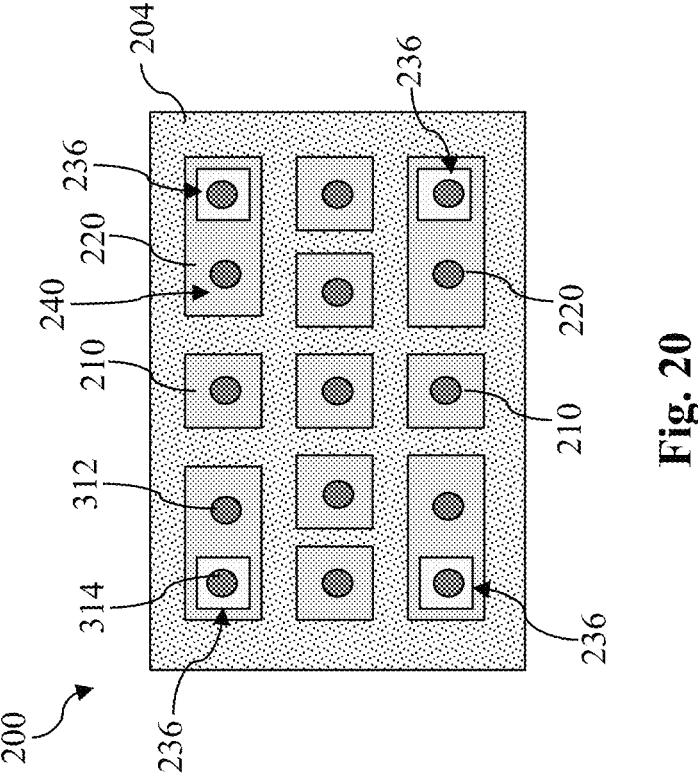

Reference is made to FIGS. 17-20. As shown in FIG. 17, when round clearance openings 230 are adopted, the contact vias 312 land either on a contact pad 210 or a via landing area 240 of a clearance pad 220. The interaction between the test vias 314 and the round clearance openings 230 provides via shift information. When no via shift is present, the test vias 314 should extend through the round clearance opening 230 with a uniform clearance between sidewalls of the test vias 314 and edges of the round clearance openings 230. When via shift is present, one or more test vias 314 may overlap or come in contact with the clearance pads 220, forming detectable electrical connections. As shown in FIG. 18, when rectangular clearance openings 232 and 2320 are adopted, the contact vias 312 land either on a contact pad 210 or a via landing area 240 of a clearance pad 220. The interaction between the test vias 314 and the rectangular clearance openings 232 and 2320 provides via shift information. When no via shift is present, the test vias 314 should extend through the rectangular clearance openings 232 or 2320. When via shift is present, one or more test vias 314 may overlap or come in contact with the clearance pads 220, forming detectable electrical connections. As shown in FIG. 19, when cross-shaped clearance openings 234 are adopted, the contact vias 312 land either on a contact pad 210 or a via landing area 240 of a clearance pad 220. The interaction between the test vias 314 and the cross-shaped clearance openings 234 provides via shift information. When no via shift is present, the test vias 314 should extend through the cross-shaped clearance openings 234. When via shift is present, one or more test vias 314 may overlap or come in contact with the clearance pads 220, forming detectable electrical connections. As shown in FIG. 20, when square clearance openings 236 are adopted, the contact vias 312 land either on a contact pad 210 or a via landing area 240 of a clearance pad 220. The interaction between the test vias 314 and the square clearance openings 236 provides via shift information. When no via shift is present, the test vias 314 should extend through the square clearance openings 236. When via shift is present, one or more test vias 314 may overlap or come in contact with the clearance pads 220, forming detectable electrical connections.

Referring to FIG. 1, method 10 includes a block 24 where a continuity test is performed to check presence of contact between test via 314 and a clearance pad 220. To perform the continuity test, the test vias 314 are in at least one circuit loop. Testing whether the test vias 314 have electrical continuity with the clearance pads 220 provides reliable information on whether the contact vias 312 are accurately formed without excessive via shift. Reference is made to FIGS. 17-20. When via shift is so severe that the test vias 314 come in contact with the edges of the clearance openings, the test vias 314 become electrically coupled to the clearance pad 220, thereby forming a detectable closed loop. When via shift is negligible, the test vias 314 remain spaced apart from edges of the clearance opening, forming an open circuit. As illustrated in FIG. 17, because the round clearance openings 230 is circular from a top view, it provides a uniform via shift information along all direction. Referring to FIG. 18, the rectangular clearance opening 232 provides tighter Y-direction via shift detection and more lenient X-direction via shift detection. The rectangular clearance opening 2320 provides tighter X-direction via shift detection and more lenient Y-direction via shift detection. Referring to FIG. 19, the cross-shaped clearance opening 234 provides tighter diagonal (i.e., 45 degree angle) via shift detection and more lenient X-direction or Y-direction via shift detection. Referring to FIG. 20, the square clearance opening 236 provides tighter X-direction or Y-direction via shift direction and more lenient diagonal (i.e., 45 degree angle) via shift detection. In some embodiments not explicitly illustrated in the figures, clearance openings of different shapes may be placed in different circuit loops and deployed on various locations on a device component 200 to detect via shift amount and direction at variation locations on a device component 200. As shown in FIGS. 17-20, the round clearance openings 230, the rectangular clearance openings 232, the cross-shaped clearance openings 234, and the square clearance openings 236 may be placed adjacent to four corners of the device component 200 when the device component 200 is rectangular in a top view.

The electrical continuity between test vias 314 and clearance pads 220 according to the present disclosure allows for definitive advance detection of via shift before a device package that includes the device component 200 is subject to a biased highly accelerated stress test (b-HAST) or a high-voltage temperature humidity bias test (HV-THB). During a b-HAST or HV-THB, a testing voltage between about 100 V and about 200 V may be applied across the contact pads 210, contact vias 312, clearance pads 220, and the test vias 314. A b-HAST or HV-THB may be carried out in a test chamber with a controlled humidity and a controlled temperature. In some instances, a relative humidity in the test chamber may be between 50% and about 100%, including between about 80% and about 90%. A temperature of the test chamber may be set at between about 70° C. and about 100° C., including between about 80° C. and about 90° C. When via shift is present such that a contact via 312 lands on or near an interface between the insulation layer 204 and a contact pad 210, the high testing voltage and harsh environment may cause delamination between the contact pad 210 and the insulation layer 204 and metal dendrites (e.g., copper dendrite) may form along the interface, causing the device package to fail the test. By implementing the clearance pads 220 and performing the continuity test, the reliability of the device package can be determined without any stress test, such as a b-HAST or HV-THB. In some alternative embodiments, a b-HAST or HV-THB may still be performed to device packages that pass the electrical continuity test to establish that their results are consistent. Additionally, when a device package fails the continuity test due to electrical connection between a test via 314 and a clearance pad 220, imaging techniques, such as optical microscopy, parallel lapping, or three-dimensional X-ray (3D X-ray), may still be used to determine how better improve laser via accuracy. It can be seen that the continuity test of the present disclosure may replace and complement the imaging techniques and stress testing. As used herein, a device package includes a core substrate (such as the core substrate 100), a device component (such as the device component 200) embedded in the core substrate, and at least one build-up structure on a top surface or a back surface of the core substrate. The first build-up film 108, the second build-up film 110, the contact vias 312, and the test vias 314 may be part of one of the build-up structures of a device package that includes the core substrate 100 and the device component 200.

Referring to FIG. 1, method 10 includes a block 26 where results of the continuity test are stored. As described above, the electrical continuity test at block 24 may be performed or replace to complement a reliability test, such as a b-HAST or HV-THB. In some embodiments, the results or data from the continuity test may be treated as part of quality check (QC) or quality assurance (QA) of a tested device package and stored in a database for future reference. In some implementations, the electrical continuity test data may be used to at least divide tested device packages into a pass category where the tested device package fails the electrical continuity test and a failure category wherein the test device package passes the electrical continuity test. In some embodiments, the device packages in the pass category or is associated with a passing result are considered device packages that pass the reliability test. The device packages in the failure category or is associated with a failing result may either be considered device package that fail the reliability test or considered ones that require further testing. For example, the device packages in the failure category or is associated with a failing result may be subject to a b-HAST or HV-THB. In some embodiments, at least a portion of the device packages that are tested at block 24 may be examined using imaging techniques, such as optical microscopy, parallel lapping, or three-dimensional X-ray (3D X-ray) to obtain additional data and information. Such additional data and information may be stored in a database as well to be used to determine an adjustment at block 28.

Referring to FIG. 1, method 10 includes a block 28 where an adjustment is determined to the patterning step at block 20. For example, when testing vias 314 over different locations are in different continuity test circuit, the stored test result may provide information on how the laser drilling requires further adjustment or alignment in certain locations. For another example, when testing vias 314 contact rectangular clearance openings 232 elongated along the X direction but not rectangular clearance openings 2320 elongated along the Y direction, the stored results indicate that the laser drilling for forming via openings are misaligned along the Y direction but the extent has not exceeded the Y-direction span of the rectangular clearance openings 2320. For yet another example, when testing vias 314 contact cross-shape clearance openings 234 but do not contact square clearance openings 236, the laser drilling for forming via openings is off along the diagonal direction (i.e., along the 45 degree angle). As described above, imaging techniques, such as optical microscopy, parallel lapping, or three-dimensional X-ray (3D X-ray), may be performed to learn how and to what extent the test vias 314 land on or contact the clearance pads 220. Data of from these imaging techniques may be used to determine the necessary adjustment to the laser drilling process at block 20.

Referring to FIG. 1, method 10 includes a block 30 where the adjustment is implemented. At block 30, the adjustment determined at block 28 may be implemented to the laser drilling process at block 20 to improve the laser via accuracy.

One aspect of the present disclosure involves a method. The method includes forming a first pad and a second pad on a device component, wherein the second pad includes a via landing area and a clearance opening, providing a core substrate that includes a cavity, placing the device component in the cavity, forming a build-up film over the device component and the core substrate, forming a first contact via extending through the build-up film to contact the landing area and a second contact via extending through build-up film and the clearance opening, and performing a continuity test to determine whether the second contact via is in contact with the second pad.

In some embodiments, an area of the second pad is greater than an area of the first pad. In some implementations, the first pad and the second pad are spaced apart from one another by a polymeric feature. In some instances, the polymeric feature includes polyimide. In some embodiments, the core substrate includes a prepreg, at least one Ajinomoto build-up film (ABF), paper, fiberglass, nonwoven glass fabric, or epoxy resin. In some implementations, the clearance opening includes a circular shape, a rectangular shape, or a cross shape in a top view. In some embodiments, the forming of the first contact via and the second contact via includes forming a first via opening and a second via opening using laser drilling, depositing a seed layer over the first via opening and the second via opening, forming a plurality of photoresist features on the seed layer, after the forming of the plurality of photoresist features, depositing a metal layer over the seed layer by electroplating, and selectively removing the plurality of photoresist features. In some instances, the method further includes storing a result of the continuity test in a database. In some embodiments, the method further includes determining an adjustment to the forming of the first via opening and the second via opening based on the stored result and implementing the adjustment. In some implementations, the device component includes a multilayer ceramic capacitor (MLCC), a deep trench capacitor (DTC), or a metal-insulator-metal (MIM) capacitor.

Another aspect of the present disclosure involves a method. The method includes forming a first pad and a second pad on a device component, wherein the first pad includes a first via landing area and a first clearance opening and the second pad includes a second via landing area and a second clearance opening, forming a build-up film over the device component, forming a first contact via and a second contact via extending through the build-up film to contact the first via landing area and the second via landing area, respectively, forming a first test via and a second test via through the first clearance opening and the second clearance opening, respectively, and performing a continuity test to determine whether the first test via contacts the first pad or whether the second test via contacts the second pad.

In some embodiments, each of the first clearance opening and the second clearance opening includes a circular shape, a rectangular shape, or a cross shape in a top view. In some embodiments, the device component has a rectangular shape from a top view. The first pad is disposed adjacent a first corner of the rectangular shape and the second pad is disposed adjacent a second corner of the rectangular shape. In some embodiments, the first pad includes a first elongated clearance opening extending lengthwise along a first direction and the second pad includes a second elongated clearance opening extending lengthwise along a second direction perpendicular to the first direction. In some instances, each of the first clearance opening and the second clearance opening is circular in shaped and includes a diameter R and each of the first test via and the second test via includes a diameter D. A ratio of the diameter D to the diameter R is between about 20% and about 50%.

Still another aspect of the present disclosure involves a semiconductor structure. The semiconductor structure includes a core structure, a device component embedded in the core structure, a pad disposed over the device component, the pad including a via landing area and a clearance opening, a build-up film disposed over the core structure and the device component, a first contact via extending through the build-up film and landing on the via landing area, and a second contact via extending through the build-up film and the clearance opening.

In some embodiments, the clearance opening includes a circular shape, a rectangular shape, or a cross shape in a top view. In some implementations, the core structure includes a prepreg, at least one Ajinomoto build-up film (ABF), paper, fiberglass, non-woven glass fabric, or epoxy resin. In some instances, a height of the second contact via is greater than a height of the first contact via. In some embodiments, the device component includes a multilayer ceramic capacitor (MLCC), a deep trench capacitor (DTC), or a metal-insulator-metal (MIM) capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first pad and a second pad on a device component, wherein the second pad includes a via landing area and a clearance opening; providing a core substrate that includes a cavity;
   placing the device component in the cavity;
   forming a build-up film over the device component and the core substrate;
   forming a first contact via extending through the build-up film to contact the landing area and a second contact via extending through build-up film and through the clearance opening to contact the device component; and
   performing a continuity test to determine whether the second contact via is in contact with the second pad.

2. The method of claim 1, where an area of the second pad is greater than an area of the first pad.

3. The method of claim 1, wherein the first pad and the second pad are spaced apart from one another by a polymeric feature.

4. The method of claim 3, wherein the polymeric feature comprises polyimide.

5. The method of claim 1, wherein the core substrate comprises a prepreg, at least one Ajinomoto build-up film (ABF), paper, fiberglass, non-woven glass fabric, or epoxy resin.

6. The method of claim 1, wherein the clearance opening comprises a circular shape, a rectangular shape, or a cross shape in a top view.

7. The method of claim 1, wherein the forming of the first contact via and the second contact via comprises:
   forming a first via opening and a second via opening using laser drilling;

12 depositing a seed layer over the first via opening and the second via opening;
   forming a plurality of photoresist features on the seed layer;
   after the forming of the plurality of photoresist features, depositing a metal layer over the seed layer by electroplating; and
   selectively removing the plurality of photoresist features.

8. The method of claim 7, further comprising:
   storing a result of the continuity test in a database.

9. The method of claim 8, further comprising:
   determining an adjustment to the forming of the first via opening and the second via opening based on the stored result; and
   implementing the adjustment.

10. The method of claim 1, wherein the device component comprises a multilayer ceramic capacitor (MLCC), a deep trench capacitor (DTC), or a metal-insulator-metal (MIM) capacitor.

11. A method, comprising:
   forming a first pad and a second pad on a device component, wherein the first pad includes a first via landing area and a first clearance opening and the second pad includes a second via landing area and a second clearance opening;
   forming a build-up film over the device component;
   forming a first contact via and a second contact via extending through the build-up film to contact the first via landing area and the second via landing area, respectively;
   forming a first test via and a second test via through the first clearance opening and the second clearance opening, respectively, to contact the device component; and
   performing a continuity test to determine whether the first test via contacts the first pad and to determine whether the second test via contacts the second pad.

12. The method of claim 11, wherein each of the first clearance opening and the second clearance opening comprises a circular shape, a rectangular shape, or a cross shape in a top view.

13. The method of claim 11,
   wherein the device component has a rectangular shape from a top view,
   wherein the first pad is disposed adjacent a first corner of the rectangular shape,
   wherein the second pad is disposed adjacent a second corner of the rectangular shape.

14. The method of claim 13,
   wherein the first pad includes a first elongated clearance opening extending lengthwise along a first direction,
   wherein the second pad includes a second elongated clearance opening extending lengthwise along a second direction perpendicular to the first direction.

15. The method of claim 13,
   wherein each of the first clearance opening and the second clearance opening is circular in shaped and comprises a diameter R,
   wherein each of the first test via and the second test via comprises a diameter D,
   wherein a ratio of the diameter D to the diameter R is between about 20% and about 50%.

16. A method, comprising:
   forming a first pad and a second pad on a device component, wherein the second pad includes a via landing area and a clearance opening;
   forming a build-up film over the device component;

forming a contact via extending through the build-up film to contact the via landing area;

forming a test via through the clearance opening to contact the device component; and performing a continuity test to determine whether the test via contacts the second pad.

17. The method of claim 16, wherein the clearance opening comprises a circular shape, a rectangular shape, or a cross shape in a top view.

18. The method of claim 16, wherein an area of the second pad is greater than an area of the first pad.

19. The method of claim 16, wherein a height of the test contact via is greater than a height of the contact via.

20. The method of claim 16, wherein the device component comprises a multilayer ceramic capacitor (MLCC), a deep trench capacitor (DTC), or a metal-insulator-metal (MIM) capacitor.

\* \* \* \* \*